United States Patent [19]

Habu

[11] Patent Number: 5,406,217

[45] Date of Patent: Apr. 11, 1995

[54] METHOD OF MEASURING THE CURRENT-VOLTAGE CHARACTERISTICS OF A DUT

[75] Inventor: Satoshi Habu, Hachiojishi, Japan

[73] Assignee: Hewlett-Packard Company, Palo Alto, Calif.

[21] Appl. No.: 919,711

[22] Filed: Jul. 24, 1992

[30] Foreign Application Priority Data

Jul. 26, 1991 [JP] Japan .................. 3-210236

[51] Int. Cl.⁶ .............................. G01R 1/04
[52] U.S. Cl. ...................... 324/765; 324/766; 324/767
[58] Field of Search ............ 324/158 F, 158 R, 158 P, 324/158 T, 73, 158 D, 766, 767

[56] References Cited

U.S. PATENT DOCUMENTS

| | | | |
|---|---|---|---|
| 2,896,168 | 7/1959 | Thomas | 324/158 T |
| 4,456,880 | 6/1984 | Warner et al. | 324/158 D |
| 4,467,275 | 8/1984 | Maeda et al. | 324/73 |
| 4,473,796 | 9/1984 | Nankivil | 324/57 |
| 4,528,503 | 7/1985 | Cole | 324/158 D |
| 5,285,151 | 2/1994 | Akama et al. | 324/158 R |

OTHER PUBLICATIONS

Maeda, et al., Intelligent Instrument Streamlines dc Semiconductor Parameter Measurements, pp. 3–14, vol. 33, No. 10, Hewlett–Packard Journal, Oct. 1982.

Hewlett Packard Operation and Service Manual, Model 4145A, Semiconductor Parameter Analyzer, Printed: Aug., 1994.

Takagi, et al., Programmable Stimulus/Measurement Units Simplify Device Setups, pp. 15–20, vol. 33, No. 10, Hewlett-Packard Journal, Oct. 1982.

*Primary Examiner*—Kenneth A. Wieder
*Assistant Examiner*—B. C. Bowser

[57] ABSTRACT

The present invention relates to a method of measuring the current-voltage characteristics of a DUT by controlling a voltage source and current source of the measurement apparatus by changing a predetermined current value in the current source or a predetermined voltage value in the voltage source in response to an output characteristic. For example, in utilizing a voltage source, the output current limiting value is incremented by a predetermined amount when the current output of a DUT reaches the current limiting value before the voltage output reaches a desired value. The current and voltage outputs of the DUT do not change unless the current limiting value is first incremented. Thus, the output characteristics with a rapid change in the DUT are more accurately measured by controlling the input and output of the DUT.

4 Claims, 6 Drawing Sheets

METHOD OF MEASURING THE CURRENT-VOLTAGE CHARACTERISTICS OF A DUT

FIELD OF THE INVENTION

This invention generally relates to a method of measuring current voltage characteristics of a device under test (DUT), and more particularly to a method of measuring a rapid change in current-voltage characteristics of the DUT, such as may occur within a breakdown region of a diode.

BACKGROUND OF THE INVENTION

Generally, a constant voltage source for current measurements and a constant current source for voltage measurements have both been utilized to measure "current-voltage characteristics" of a device under test (DUT) such as a semiconductor element. U.S. Pat. No. 4,467,275 has been assigned to the same assignee of an application which has been also published as Japanese Laid-Open Patent Publication No. 59(1983)-75073. The '275 patent discloses a signal source/measurement unit or a stimulus measurement unit (SMU) which can alternatively act as a voltage source/a current monitor or as a current source/a voltage monitor. By utilizing a SMU, a device under test can be characterized without changing external connections, and resulting data can be manipulated and displayed in a wide variety of graphical or tabular forms.

Conventionally, a current flowing through a DUT or a voltage across the DUT (which is generally called "load"), has been measured by applying a known value of either voltage from the voltage source or current from the current source. By using a SMU, the voltage source function is performed to measure a current output through a DUT, or the current source function is performed to measure a voltage output thereacross. Hereafter, an output voltage refers to a known voltage value outputted by the voltage source or for the SMU application, a corresponding voltage output value when the current flows through the DUT. An output current refers to the current flowing through the DUT or for the SMU application, a corresponding current flowing through the DUT when a known voltage is applied from the SMU. Thus, a single output characteristic of the DUT (e.g., voltage versus current) is measured. By varying (sweeping) such applied voltage or current over a predetermined range, the output characteristics of the DUT over the sweeping range are obtained.

In addition, such a voltage source and/or current source is provided with an output restriction function to protect the DUT in case of a failure. When a current flowing through the load during an application of voltage reaches a predetermined current limiting value of the voltage source, the output restriction function does not allow an excessive amount of current to flow through the load. Thus, it substantially serves as a constant current source. Similarly, when an output voltage during an application of current reaches the output voltage limiting value of the current source, the output restriction function does not allow an excess amount of voltage. Thus, it substantially serves as a constant voltage source.

Figure 1A:
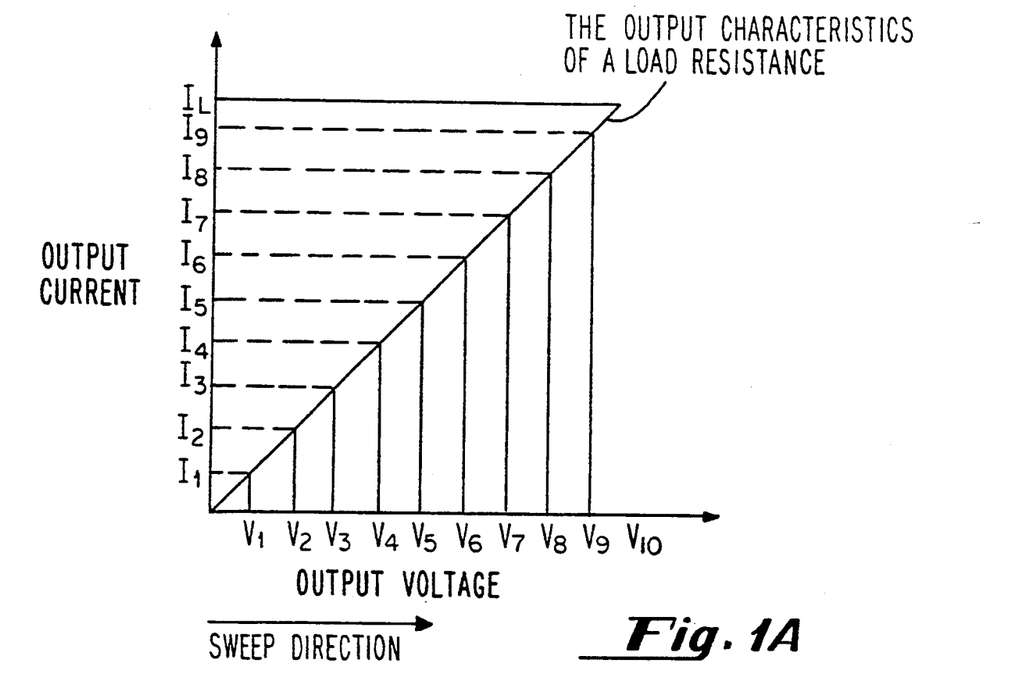
FIGS. 1A and 1B illustrate the conventional method of sweeping voltage and current respectively to obtain data representative of the current-voltage characteristics of a resistive DUT.

FIG. 1A shows the current-voltage characteristics of a load resistance, when they are conventionally measured by using a voltage source, wherein the output current limiting value of the current source is fixed at $I_L$, and a given voltage output is swept from $V_1$ to $V_{10}$. At each corresponding voltage output current flowing through the load resistance is changed, accordingly from $I_1$ to $I_L$. When an output of the voltage source varies from $V_9$ to $V_{10}$, the current flowing through the load resistance reaches a given output current limiting value of the voltage source, $I_L$. Thus, the current flowing through the load would not exceed $I_L$.

Figure 1B:
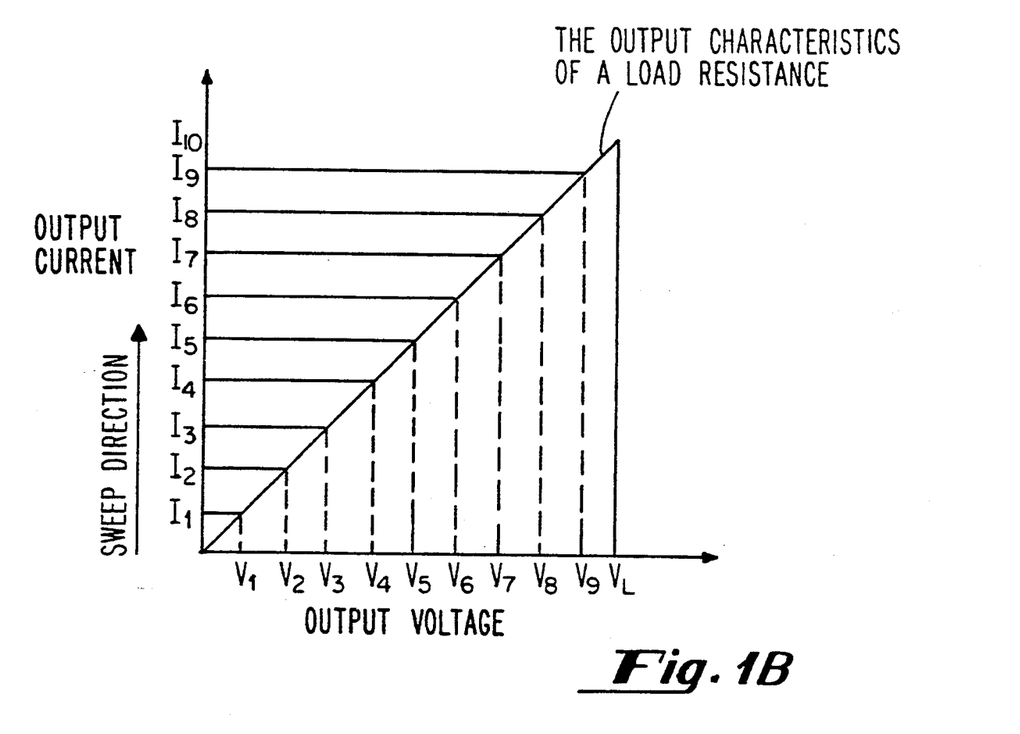

On the other hand, FIG. 1B shows the current-voltage characteristics of the load resistance measured by using a current source. The output voltage limiting value of the current source is fixed at $V_L$, and the current sweeps from $I_1$ to $I_{10}$ in order. At each corresponding output current, the voltage across the load resistance is varied, proceeding from $V_1$ to $V_L$. When the output of the current source is changed from $I_9$ to $I_{10}$, the output voltage reaches the output voltage limiting value, $V_L$, so that the voltage across the load resistance is limited to $V_L$.

Figure 2A:
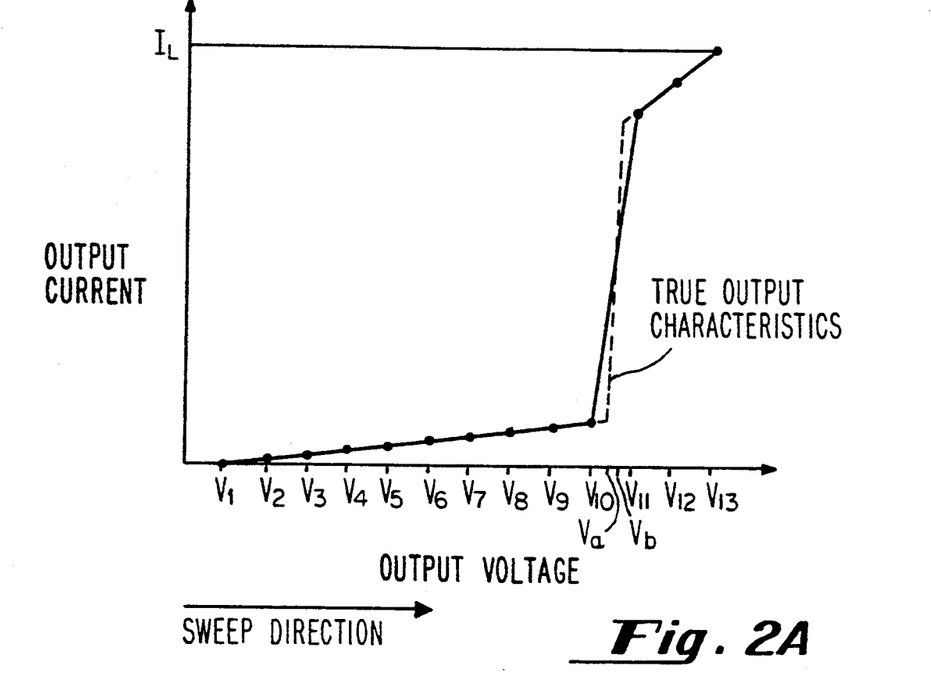
FIGS. 2A and 2B show data points obtained for the current-voltage characteristics of a diode in accordance with a conventional method.
Figure 2B:
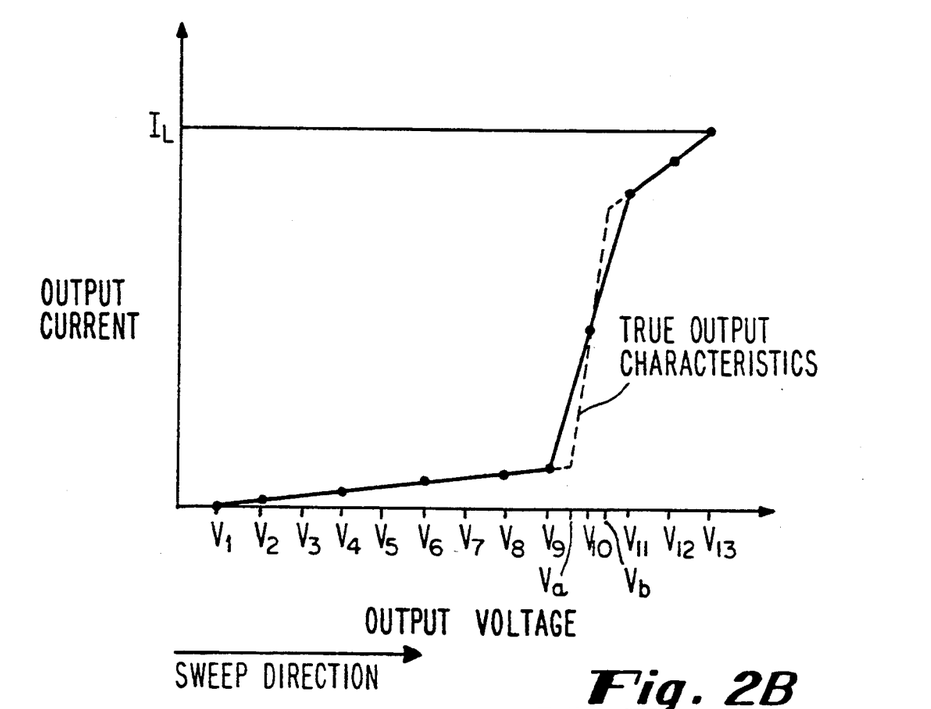

However, these conventional methods have several problems as will be described below. The problems become apparent especially when a rapid change in the output characteristics of the load is measured, such as the breakdown region of a diode. FIGS. 2A and 2B show a voltage which has been swept from $V_1$ through $V_{13}$ and a current flowing through the load at each voltage. FIG. 2A shows a rapid change in the current flow through the load in response to changing the output voltage applied to the load between $V_{10}$ and $V_{11}$. Such a rapid change in current is not seen, i.e., the monitored characteristic is very imprecise. Even when the output voltage (sweep voltage) $V_{10}$ falls between Va and Vb as shown in FIG. 2B, a precise measurement of such a rapid change cannot be accomplished as a huge change in the current output of a voltage source occurs over a very short range of the applied voltage.

In order to solve the above-described problems, two conventional approaches have been attempted as follows: One approach is to reduce the amount of increment in the voltage output (sweep voltage step). This approach may be effective for a measurement of the output characteristics of a load whose voltage output region has at least one rapid change. For example, the load as shown in FIG. 2A has one rapid change between $V_{10}$ and $V_{11}$. However, the overall efficiency of the measurements is sacrificed. That is, this would require, for instance, an extensive sweep time and consume a great amount of memory in the measuring device.

The other approach is to utilize a current source in place of a voltage source. Although this would allow the measurement of the output characteristics of a load with a rapid change in its current output, a rapid change in its voltage output, e.g., from $V_1$ to $V_{10}$ still cannot be precisely determined.

The object of the present invention is, therefore, to overcome the above-described problems of the conventional methods, and to provide a method of more accurately and efficiently measuring the current-voltage characteristics of a DUT. Another object is to provide a method of more precisely measuring a rapid change in the output characteristics of the DUT.

SUMMARY OF THE INVENTION

The present invention relates to a method of measuring the current-voltage characteristics of a DUT by controlling a voltage source and current source of a measuring apparatus, by adopting a predetermined output current and predetermined output voltage in response to the output characteristics of the DUT.

In the case of utilizing a voltage source, a plurality of output current limiting values which are incremented by a predetermined amount are provided. When the output current of the DUT reaches a limiting value before the output voltage reaches a next given value, a data point is taken at the current limiting value and then the current limiting value is incremented, after which the output voltage is increased toward its next given value. In this way, DUT output characteristics with a rapid change are obtained by controlling the input and output of the DUT.

In the case of utilizing a current source, a plurality of output voltage limiting values which are incremented by a predetermined amount are provided. When the output voltage of the DUT reaches a limiting value before the current output reaches a next given value, a data point is taken at the voltage limiting value and then the voltage limiting value is incremented, after which the output current is increased toward its next given value. In this way, DUT output characteristics with a rapid change are obtained by rolling the input and output of the DUT.

DETAILED DESCRIPTION OF THE PREFERRED EMBODIMENT

Figure 3:
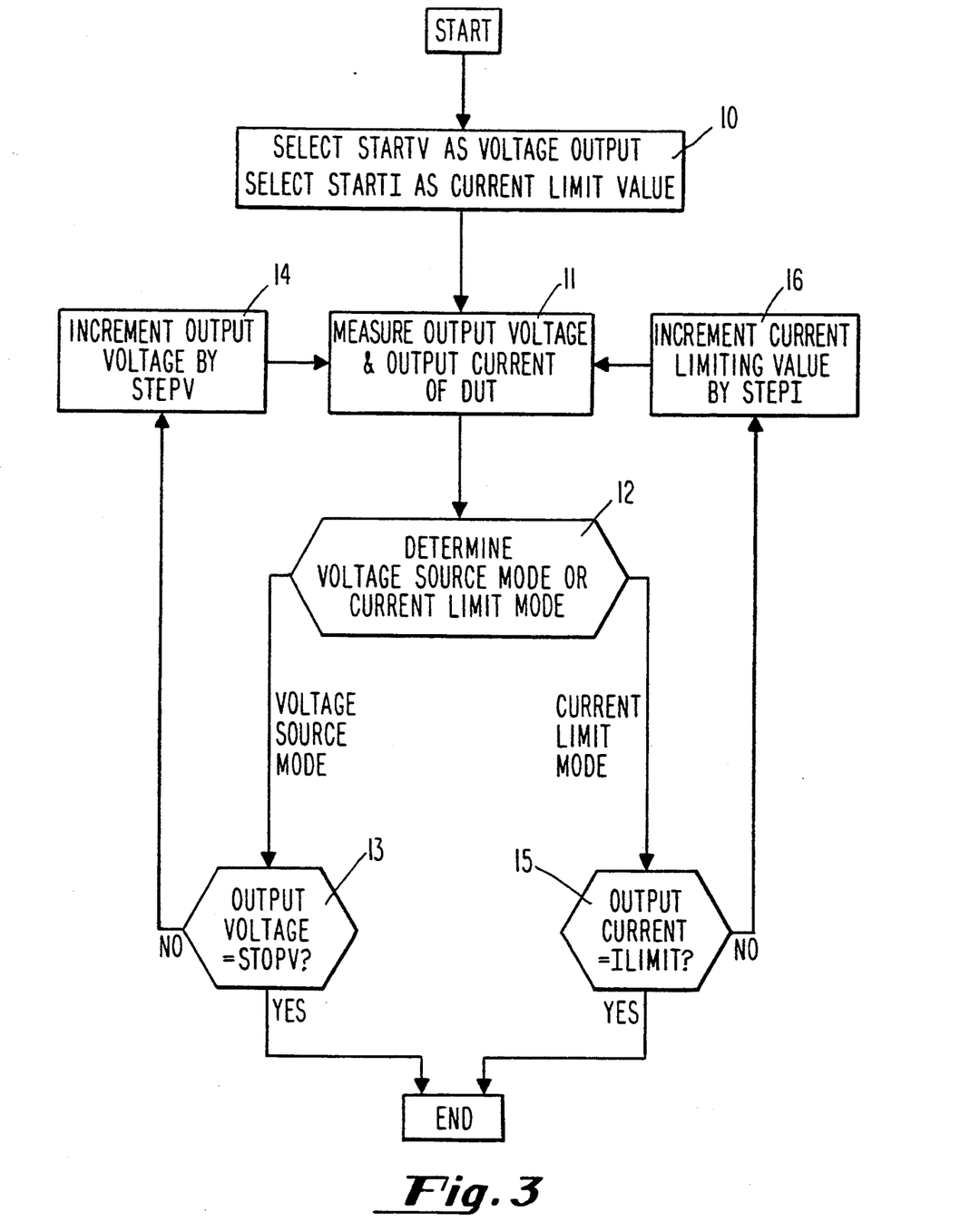
FIG. 3 is a flow chart of one embodiment of the present invention.

FIG. 3 is a flow chart for one embodiment in accordance with this invention. A voltage source is used for measurements in this embodiment. Variables used in this embodiment are defined as follows: StartV represents an initial sweep voltage; StopV represents an end sweep voltage; StepV represents an incremented amount for the sweep voltage; StartI represents a current limiting value which is set when the sweep is initiated; StepI represents an incremental current limiting value; and Ilimit is a maximum current limiting value. The determination of StartV, StepV, StartI and Ilimit values for a particular DUT has been known to one of ordinary skill as disclosed for example in handbooks and text books. Operational manuals of HP4142B and HP4145A (Hewlett-Packard) or Hewlett-Packard Journal articles also disclose related subject matter of the current invention: "Intelligent Instrument Streamlines dc Semiconductor Parameter Measurements," Maeda et al , pp 3–14, HPJ, Vol. 33, No. 10 (1982); "Programmable Stimulus/Measurement Units Simplify Device Test Setups," Takagi et al., pp. 15–20, Vol. 33, No. 10 (1982). On the other hand, the StepV and StepI values according to one preferred embodiment of the current invention may be respectively 1/100 of (StopV−StartV) and (Ilimit−StartI).

At Step 10 of FIG. 3, a voltage output of the voltage source is first set at StartV while the current limiting value of the voltage source is set at StartI. StartV is applied to a DUT. At Step 11, the voltage across the DUT and current flowing through the DUT are measured. It is then decided from the measured outputs in Step 12 whether the voltage source is in the voltage source mode or current limiting mode. The voltage source mode is defined as a state of the voltage source where its output voltage is actually applied to a DUT. The current limiting mode is defined as a state of the voltage source in which a current flowing through a DUT reaches the current limiting value and any excess amount of current over the limiting value, flowing through a DUT is restricted. Such a decision can be carried out by various well-known means including a computer or hardware controlled voltage source. If it is determined that the voltage source is in the voltage source mode, it goes to Step 13 where it is determined whether the output voltage is equal to Stopv. If the output voltage is equal to StopV, the measurement operation is terminated. However, if it is not equal to StopV, the output voltage of the voltage source is incremented by StepV in Step 14 and the operation from Step 11 is repeated. If the voltage source is determined to be in the current limiting mode at Step 12, Step 15 next determines whether the output current is equal to Ilimit. If it is equal to Ilimit, the measurement operation is terminated. However, if it is not equal to Ilimit, it goes to Step 16 to increment the current output limit value of the voltage source by StepI, and the operation from Step 11 is repeated.

When it cannot be determined whether the voltage source is in the voltage source mode or current limit mode as both conditions at Step 12 are satisfied, it is predetermined that one of the two modes is always selected. This situation may occur when a rapid change in output voltage or output current occurs.

Figure 4:
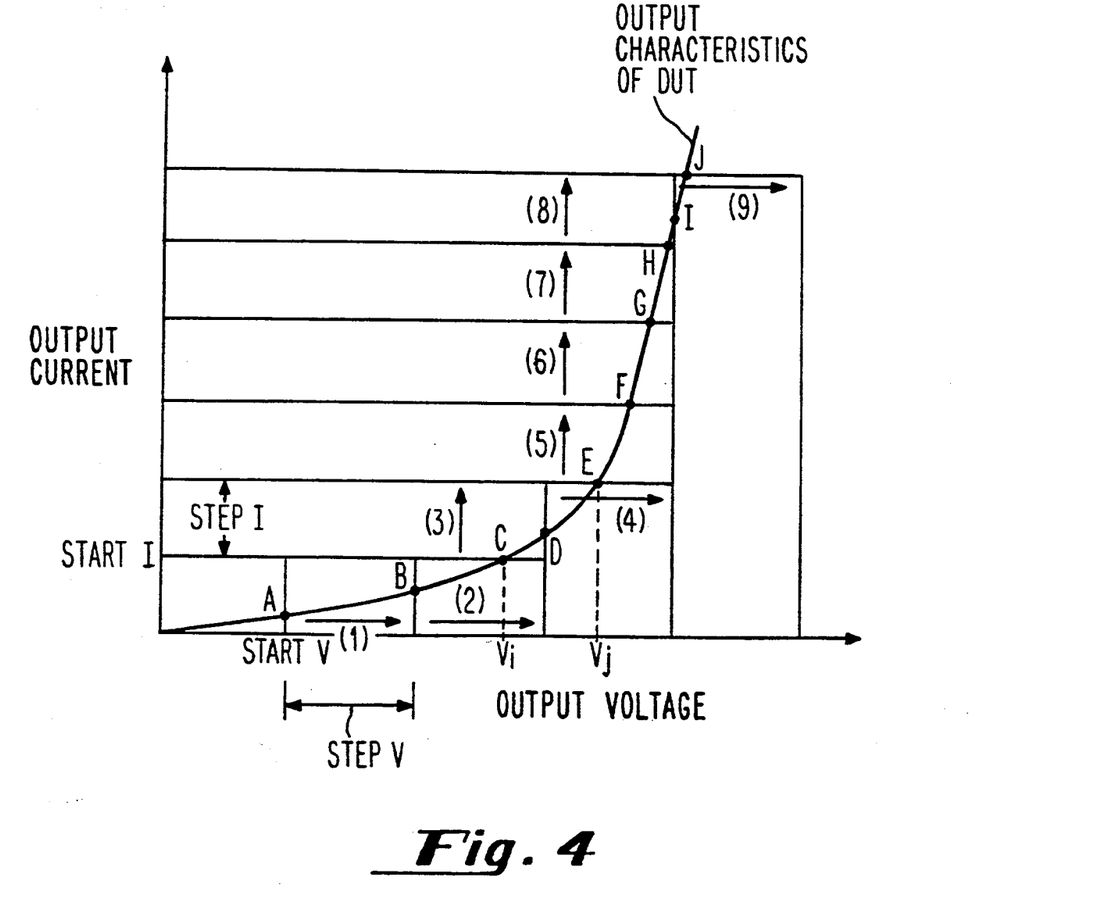
FIG. 4 is a graph showing an output characteristic of a DUT obtained by the method as shown in FIG. 3.

The present invention is now further described in reference to FIG. 4 which shows the current-voltage output characteristics of a DUT measured in accordance with the above-described method. Current-voltage characteristics of a DUT is conventionally obtained by applying different levels of voltage from a voltage source to a DUT and measuring resulted current flowing through the DUT. The preferred embodiment according to the present invention as shown in FIG. 4 measures both a voltage across the DUT and a current flowing through the DUT if such result reaches either output voltage or current limiting value of the voltage source. These measurement results are plotted as shown in FIG. 4. At the beginning, the output voltage and current limiting value are respectively set as StartV and StartI. The resulting output voltage across a DUT and current flowing through the DUT are plotted at Point A. The voltage source at Point A is in the voltage source mode wherein the current flowings through a DUT is below the present current limiting value. The output voltage of the voltage source is then set towards a value of StartV+StepV as indicated by an arrow (1). The measurement result is shown at Point B. It is apparent that the voltage source still remains in the voltage source mode, and a current flowing through a DUT is still below the current limiting value. Accordingly, the voltage source increases its output voltage towards a value of StartV+2(Stepv) as indicated by an arrow (2).

At Point Ct the output current is equal to the present current limiting value of the voltage source, StartI. Thus, an excess amount over StartI does not flow through the DUT. As a result, the increment in the output voltage is limited to Vi, approximately half of Stepv. A voltage across a DUT would not reach the present output voltage, StartV+2 (StepV) of the voltage source and balanced at Vi (Point C). Since the voltage source at this point is determined to be in the current limiting mode, the current limiting value is incremented by StepI as indicated by an arrow (3). Accordingly, the output current is changed to point 0 as the output voltage is further incremented to StartV+2 (StepV). The output voltage of the voltage source is now set towards a value of StartV+3 (StepV). As the output voltage increases, the current output again reaches the present current limiting value of StartI+StepI before the output voltage across the DUT reaches present set value of StartV+3 (StepV), as indicated by an arrow (4). The output voltage across the DUT is tentatively fixed at Vj as indicated at Point E. The current limiting value is increased by StepI as indicated by an arrow (5). Similarly, the current flowing through a DUT is further and rapidly incremented by StepI when the current flowing through the DUT reaches each of current limiting Points F, G, and H as respectively indicated by the arrows (6), (7) and (8), while the output voltage is further incremented towards a value of StartV+3 (StepV) as indicated by Point I. When the output voltage reaches the present output voltage goal at Point I, the voltage is set to increment towards StartV+4 (StepV) as indicated by an arrow (9). The measurement operation is completed when either of measured voltage value or measured current value of a DUT reaches the maximum value of output voltage (StopV) or current limiting value (Ilimit) of the voltage service.

In a conventional method of measuring the current-voltage characteristics, a current flowing through a DUT can be sampled by an application of given voltage from a voltage source at Points A, B, D and I. By systematically increasing the current limiting value by a desired amount, the present embodiment of the present invention enables a more precise measurement of a number of data points in the rapid change region such as region indicated by arrow (4). The measurements such as at Points Of E, F, G and H are obtained by the above described embodiment of the invention without affecting the efficiency of the measurement in the non-rapid change regions. Therefore, it is understood to those skilled in the art that the present invention achieves, in comparison with the prior art, a more precise measurement of the output characteristics (current-voltage characteristic) of a DUT, while optimizing efficiency.

Figure 5:
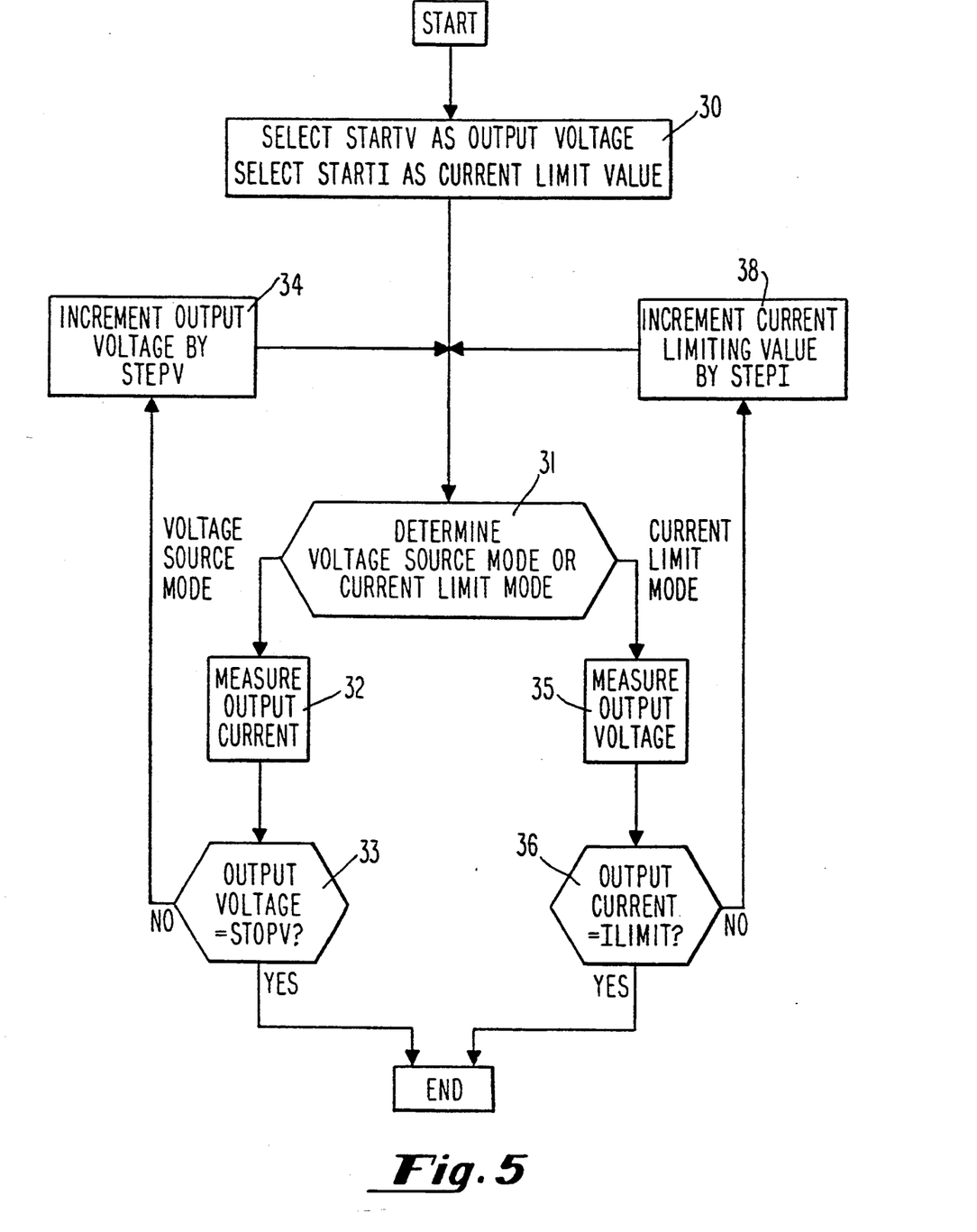
FIG. 5 is a flow chart of another embodiment of the present invention.
Figure 6:
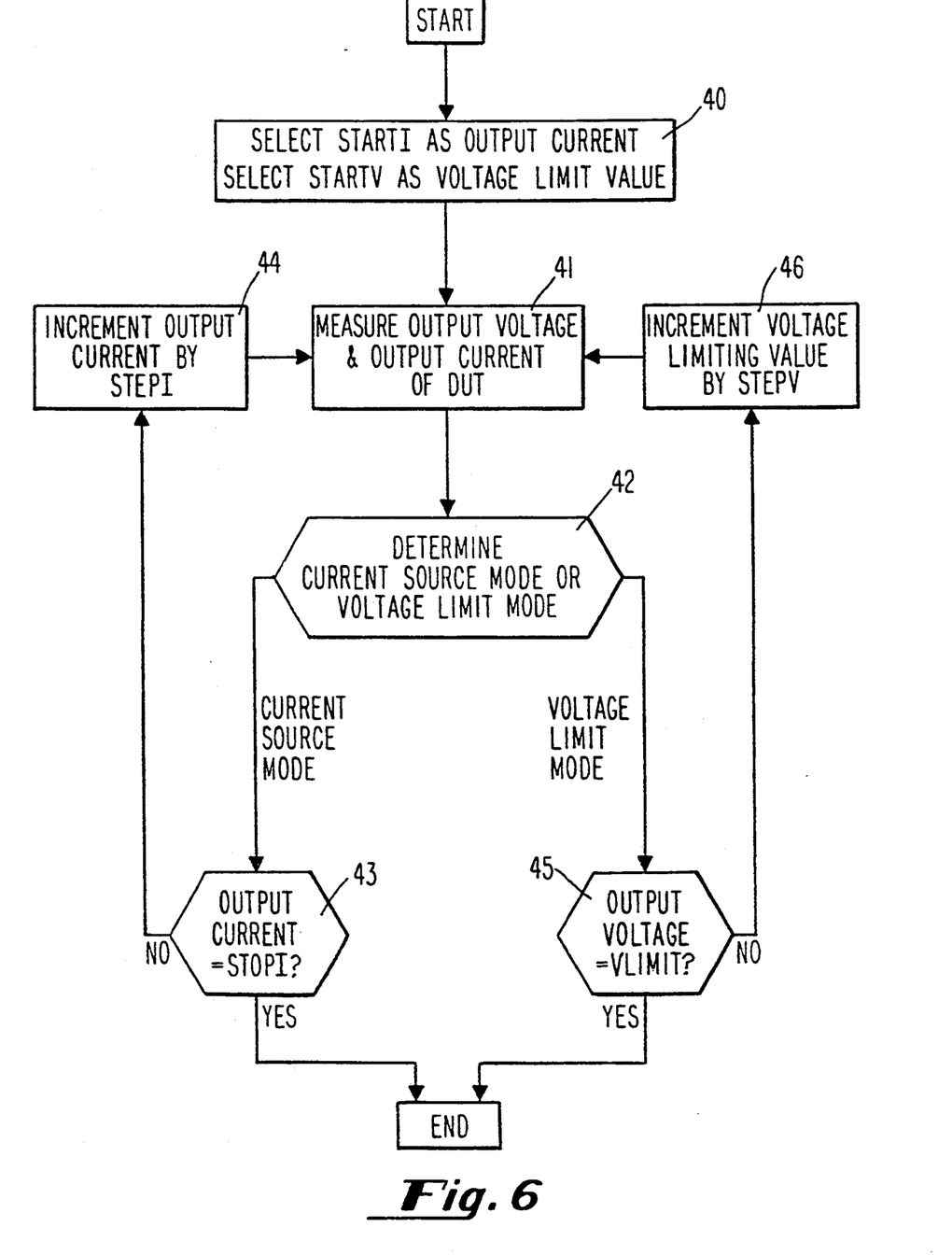
FIG. 6 is a flow chart of yet another embodiment of the present invention.

FIG. 5 shows another embodiment of the present invention utilizing a voltage source. In this embodiment, the mode of the voltage source i.e. the voltage source mode or the current limit mode is determined on the basis of a predetermined condition or the like in step 31. It will be understood to those skilled in the art that various kinds of determinations can be employed. For example, the SMU is used to make such determinations. Furthermore, after the mode of the voltage source is determined, only one measurement is required, i.e., voltage or current; this improves time efficiency. When it is determined that the voltage source is in the voltage source mode, only the current flowing through a DUT is measured in Step 32. If the applied voltage is not yet equal to StepV in Step 33, the output voltage from the voltage source is incremented by StepV in Step 34 to repeat the process from Step 31. If the applied voltage is equal to StepV in Step 33, the process terminates. On the other hand, if it is determined that the voltage source is determined to be in the current limiting mode in Step 31, only the output voltage is measured in Step 35. If the present current limiting value is not yet equal to StopI in Step 36, the current limiting value is incremented by StepI in Step 38 to repeat the process from Step 31. If the current limiting value is equal to StopI in Step 36, the process terminates. Other embodiments of the present invention utilizing a current source can also be implemented in the same manner as described above in place of voltage, as shown in FIG. 6. The operations are equivalent to the previous embodiment except for controlling the output current of a current source instead of the output voltage of a voltage voltage source is determined to be in the current limiting mode in Step 31, only the output voltage is measured in Step 35. If the present current limiting value is not yet equal to StopI in Step 36, the current limiting value is incremented by StepI in Step 38 to repeat the process from Step 31. If the current limiting value is equal to StopI in Step 36, the process terminates. Other embodiments of the present invention utilizing a current source can also be implemented in the same manner as described above in place of voltage, as shown in FIG. 6. The operations are equivalent to the previous embodiment except for controlling the output current of a current source instead of the output voltage of a voltage source. Thus, steps 41–46 correspond to Steps 11–16 of FIG. 6.

This invention allows an efficient and more precise measurement of the rapid change portion of the current-voltage characteristics of a DUT, by improved control of both the current and voltage outputs of a DUT.

What is claimed:

1. A method of measuring current-voltage characteristics of a device under test (DUT), comprising the steps of:
   (a) selecting a plurality of current limiting values for a current flowing through the DUT;
   (b) applying a voltage toward a predetermined voltage value to the DUT from a voltage source with respect to a present current limitation at one of said current limiting values;
   (c) measuring the current flowing through the DUT in response to the applied voltage;
   (d) determining if the measured current in the step (c) has reached said present current limitation;
   (e) recording the applied voltage and incrementing the present current limitation to the next of said plurality of current limiting values when the measured current in the step (c) reaches the present current limitation in step (d);
   (f) repeating steps (b) to (e) until said applied voltage reaches said predetermined voltage, and then measuring the current value and increasing said voltage by a predetermined amount; and repeating steps (b) to (f) until either the current flowing through the DUT or the applied voltage reaches a corresponding predetermined maximum value for said DUT.

2. A method as claimed in 1, further comprising the step of monitoring a control status of the voltage source to determine whether the output voltage has reached the predetermined voltage value.

3. A method of measuring current-voltage characteristics of a device under test (DUT), comprising the steps of:
   (a) selecting a plurality of voltage limiting values for a voltage across the DUT;
   (b) applying a current towards a predetermined current value to the DUT from a current source with respect to a present voltage limitation at one of said voltage limiting values;
   (c) measuring a voltage across the DUT;
   (d) determining if the measured voltage in the step (c) has reached the present voltage limitation;
   (e) recording the applied current and incrementing the present voltage limitation to the next of said plurality of voltage limiting values when the measured voltage in the step (c) reaches the present voltage limitation in step (d);
   (f) repeating steps (b) to (e) until said applied current reaches said predetermined current, and then measuring the voltage value and increasing said current by a predetermined amount; and repeating steps (b) to (f) until either the applied current or the output voltage reaches a corresponding predetermined maximum value for said DUT.

4. A method as claimed in 3 further comprising a step of monitoring a control status of the current source to determine whether the output current has reached the predetermined current value.

* * * * *

UNITED STATES PATENT AND TRADEMARK OFFICE
CERTIFICATE OF CORRECTION

PATENT NO. : 5,406,217
DATED : April 11, 1995
INVENTOR(S) : Satoshi HABU

It is certified that error appears in the above-indentified patent and that said Letters Patent is hereby corrected as shown below:

At column 3, line 65, insert --.-- after "al" and "pp".

At column 6, line 18, delete the third occurrance of the word "voltage".

At column 6, delete the text beginning at line 18 from (and including) the third occurrence of the word "voltage" through line 32, to (and including) the second occurrence of the word "voltage".

Signed and Sealed this

Twenty-seventh Day of August, 1996

Attest:

BRUCE LEHMAN

*Attesting Officer*  *Commissioner of Patents and Trademarks*